United States Patent [19]

English et al.

[11] 4,213,087
[45] Jul. 15, 1980

[54] METHOD AND DEVICE FOR TESTING ELECTRICAL CONDUCTOR ELEMENTS

[75] Inventors: Alan T. English, Summit; Gabriel L. Miller, Westfield, both of N.J.

[73] Assignee: Bell Telephone Laboratories,, Murray Hill, N.J.

[21] Appl. No.: 949,578

[22] Filed: Oct. 10, 1978

Related U.S. Application Data

[63] Continuation-in-part of Ser. No. 847,213, Oct. 31, 1977, abandoned.

[51] Int. Cl.² ............................................. G01R 27/02
[52] U.S. Cl. ...................................................... 324/62
[58] Field of Search ................. 324/62, 73 PC, 158 R

[56] References Cited

FOREIGN PATENT DOCUMENTS 269293 1/1971 U.S.S.R. ..................................... 324/62

Primary Examiner—Stanley T. Krawczewicz
Attorney, Agent, or Firm—Peter A. Businger

[57] ABSTRACT

A method and a device implementing the method are disclosed for testing electrical conductor elements in the manufacture of integrated circuit devices. The method is based on determining nonlinearity of electrical resistance, a quantity which was found to be closely related to reliability of conductor elements. The method calls for applying a repetitive train of pulses to an AC-coupled linear network across whose output terminals the element being tested is placed. The resulting average current through or voltage across the element provides a measure of nonlinearity of resistance.

17 Claims, 5 Drawing Figures

METHOD AND DEVICE FOR TESTING ELECTRICAL CONDUCTOR ELEMENTS

CROSS-REFERENCE TO RELATED APPLICATION

This application is a continuation-in-part of application Ser. No. 847,213, filed Oct. 31, 1977, now abandoned.

BACKGROUND OF THE INVENTION

1. Field of the Invention

The invention is concerned with the testing of electrical conductor elements in the manufacture of integrated circuit devices.

2. Description of the Prior Art

Electrical conductor elements such as gold, aluminum, or suitably doped silicon stripes deposited on a substrate are commonly used in integrated circuit devices to electrically connect active and passive circuit components. Such elements typically have a thickness on the order of a fraction of a micrometer and a width on the order of a few micrometers and, consequently, can be inspected visually only by means of magnifying equipment such as a microscope. Moreover, visual inspection is too time-consuming to be practical in the context of large scale industrial production of integrated circuitry.

While gross defects such as discontinuities in conductor stripes become manifest immediately upon functional testing of a circuit, other defects may go undetected initially but may yet result in premature failure of a device in use. To identify such potentially short lived conductor elements, a so-called third harmonic method has been proposed for testing conductor stripes. This method is based on the observation that conductor stripes which are prone to fail, e.g., due to nonuniformity of width, thickness, composition, or adhesion to the substrate, typically exhibit nonlinearity of resistance as a function of current. According to the third harmonic method a fundamental sinusoidal signal is applied to a linear AC-coupled network across whose output terminals the conductor element to be tested is placed. By measuring the amplitude of the third harmonic component of the output signal a measure for the nonlinearity of resistance of the circuit element is obtained. Successful application of this method is described in "The Nonlinearity of Fixed Resistors" by P. L. Kirby, *Electronic Engineering*, November, 1965, pages 722–726, and in "Harmonic Testing Pinpoints Passive Components Flaws" by Vilhelm Peterson and Per-Olof Harris, *Electronics*, July 11, 1966, pages 93–100. However, due to the need for a signal generator which produces a signal of extremely low harmonic contents, test equipment implementing the third harmonic method tends to be complicated and poorly suited for use in the large scale testing of integrated circuitry.

SUMMARY OF THE INVENTION

It has been realized that non-linearity of resistance of a nominally linear conductor element can be determined by placing the conductor element across the output terminals of an AC-coupled linear network to which a repetitive train of pulses is applied. By measuring the resulting average current through or voltage across the element a measure of nonlinearity of resistance of the conductor element is obtained. The new test for nonlinearity may be applied simultaneously to a plurality of conductor elements such as thin film conductor stripes on an integrated circuit chip and provides for an estimate of the reliability of such conductor stripes.

DETAILED DESCRIPTION

Figure 1:
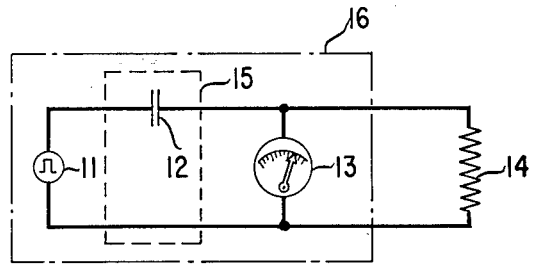
FIG. 1 is a diagram of an exemplary circuit which can be used for determination of nonlinearity of resistance by the disclosed method.

FIG. 1 shows current generator 11 and AC-coupled linear network 15 which consists of blocking capacitor 12. Averaging voltmeter 13 measures the average voltage across conductor element 14 which is being tested for nonlinearity of resistance by the disclosed method. Generator 11, network 15, and voltmeter 13 are shown inside enclosure 16.

Figure 2:
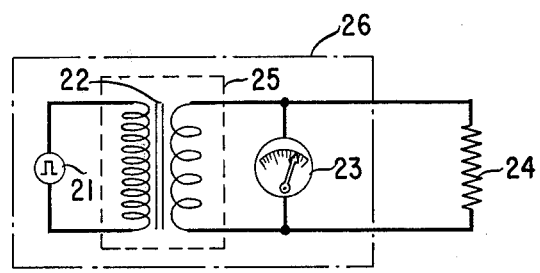
FIG. 2 is a diagram of an alternate exemplary circuit which can be used for determination of nonlinearity of resistance by the disclosed method.

FIG. 2 shows current generator 21 and AC-coupled linear network 25 consisting of transformer 22. Averaging voltmeter 23 measures the average voltage across conductor element 24 which is being tested for nonlinearity of resistance by the disclosed method. Generator 21, network 25, and voltmeter 23 are shown inside enclosure 26.

Figure 3:
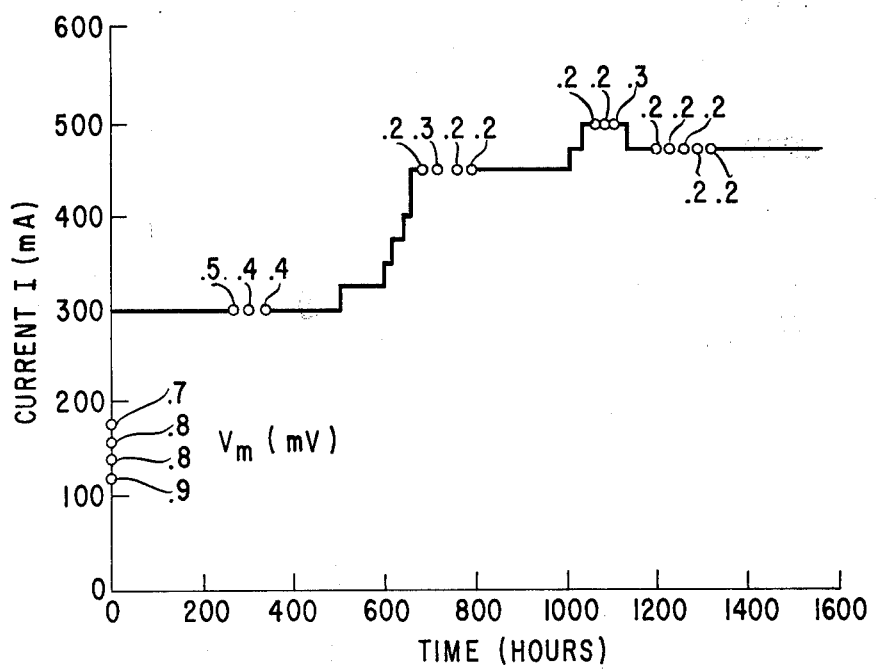
FIG. 3 is a graphical representation of test results.

FIG. 3 shows current as a function of time in a stepped stress high current test of a number of aluminum conductors. Points marked and labelled indicate failure of the circuit element, the numerical value of the label being the voltage measured by voltmeter 13 of FIG. 1. It can be seen that high measured voltage is directly related to early failure of the circuit element.

Figure 4:
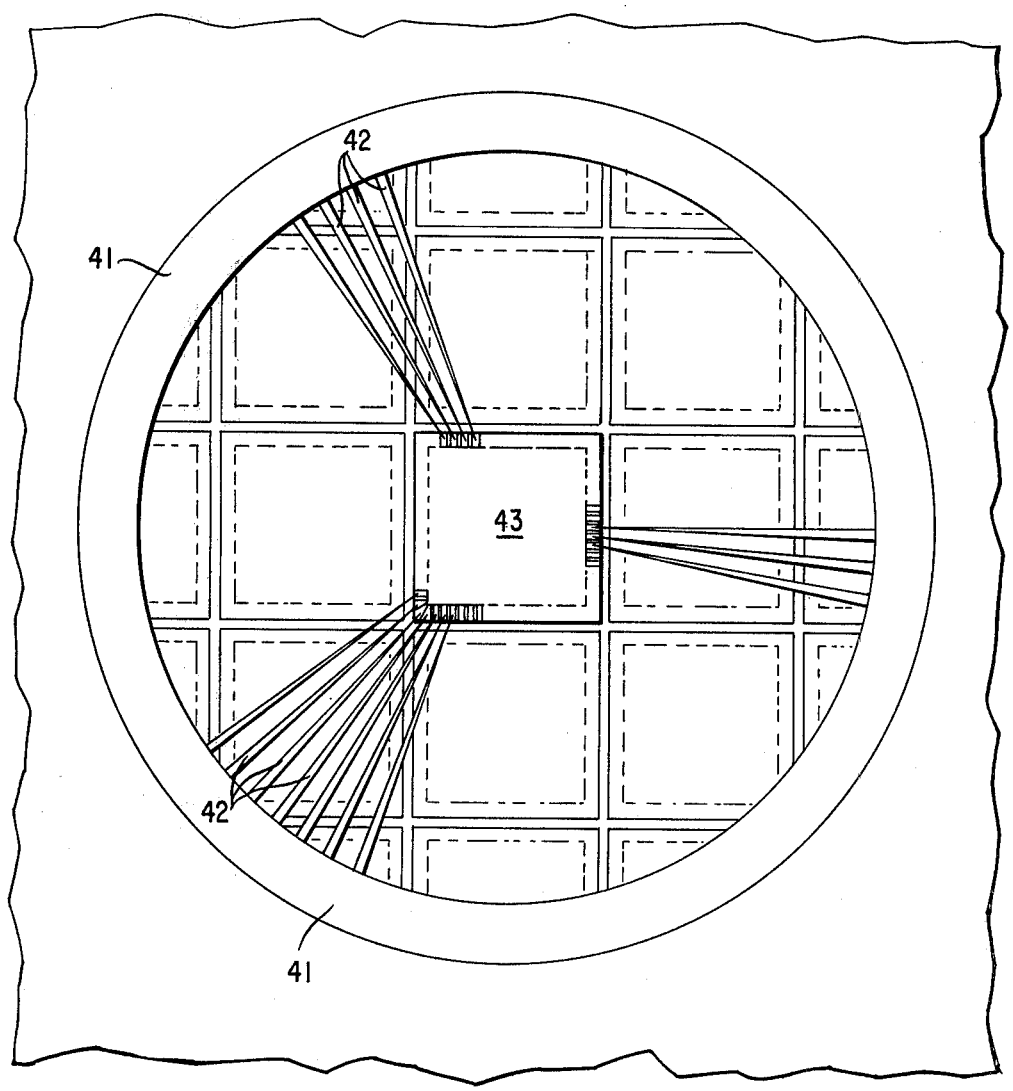
FIG. 4 shows a test station for testing microcircuitry.

FIG. 4 shows electrically insulating rim 41 of a test station for microcircuitry. Probes 42 are attached to rim 41 and electrically connected to test circuitry which is not shown. The tips of probes are aligned with and pressed against contact pads located along the edges of device 43 being tested.

Figure 5:
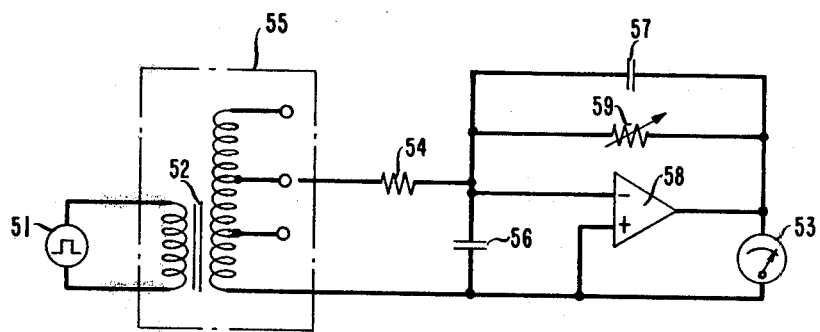
FIG. 5 is a diagram of an alternate exemplary circuit which can be used for determining nonlinearity of resistance according to the disclosed method.

FIG. 5 shows voltage generator 51 and AC-coupled linear network 55 consisting of transformer 52. Conductor element 54, which is being tested for nonlinearity of resistance by the disclosed method, is connected to a network consisting of capacitors 56 and 57, operational amplifier 58, and variable feedback resistor 59. Voltage measured by voltmeter 53 is proportional to the average current flowing in conductor element 54 which average current, according to the invention, is a measure of nonlinearity of resistance of element 54.

The disclosed method aims at determining reliability of conductor elements by means of a determination of nonlinearity of resistance, i.e., of deviation from Ohm's law of a linear relationship between voltage applied to and current flowing in the conductor element. Such deviation typically amounts to a change in resistance as a result of an increase in voltage or current and may be expressed quantitatively by the parameter $\lambda$ in the formula $$R_I = R_0(1 + \lambda I^2)$$

which approximately represents the functional relationship between current I, nominal resistance $R_0$, and resistance $R_I$ of a conductor element. It can be shown that this functional relationship is compatible with a physical explanation of nonlinearity of resistance due to Joule heating of the conductor element.

The operation of the disclosed method may be conveniently described by reference to FIG. 1. It can be shown that if generator 11 produces a rectangular current waveform of magnitude I and duty cycle F, the voltage V measured by averaging voltmeter 13 is expressed by the formula $$V = \lambda R_0 I^3 F(1-F)(1-2F)$$

from which the direct relationship between voltage V and nonlinearity $\lambda$ is apparent. It is also apparent that if a duty cycle of F=0.5 is utilized, then V=0 independent of the value of the parameter $\lambda$. Consequently, a waveform having a duty cycle of 50 percent is ineffective for the purpose of nonlinearity testing. On the other hand, it has been determined that duty cycles $F_1 = 0.21$ and $F_2 = 0.79$ produce a maximized value $V_m$ of the average voltage V. Consequently, duty cycles of approximately 20 percent or approximately 80 percent are particularly advantageous to fully exploit the capabilities of a voltmeter having limited sensitivity. More generally, a duty cycle in the range of from ten percent to 40 percent or in the range of from 60 percent to 90 percent is suitable for sufficiently accurate determination of nonlinearity.

Relationships between average voltage V and nonlinearity $\lambda$, similar to those stated above, hold for waveforms other than rectangular waveforms. Furthermore, networks other than network 15 of FIG. 1 may be beneficially employed for the purpose of the invention. In particular, as shown in FIG. 2, transformer 22 may be used instead of the blocking capacitor 12 of FIG. 1. What is required, in general, is that the network 15 be linear and AC-coupled.

In addition to a method of measuring average voltage across a conductor element in response to a current signal having zero time average as described above, a dual method and corresponding apparatus based on current-voltage duality are also within the scope of the invention. Specifically, such dual method and apparatus are based on the fact that if a voltage signal having zero time average is applied to a conductor element, a resulting average current flowing in such conductor element is a measure of nonlinearity of resistance. Apparatus implementing this dual method is depicted in FIG. 5 where average current is shown being measured by means of an operational amplifier.

EXAMPLE

Forty-five aluminum conductors deposited on a magnetic bubble device were tested by the disclosed method. The conductors had a thickness of 0.5 micrometer and had varying width of not less than 3 micrometers. An HP8007 pulse generator was used which produces rectangular pulses up to 10 volts out of a 50 ohm source impedance. A pulse repetition rate of 20 kHz was chosen and the voltage appearing across the test conductors was filtered with a ten ms. RC filter and measured with a digital voltmeter having 10 microvolt sensitivity. The 45 conductors produced values $V_m$ in the range of from 0.1 to 1.0 mV, the majority producing values in the range of from 0.1 to 0.2 mV. Conditions under which conductors failed are depicted in FIG. 3 which shows how the lifetime of conductors is correlated to the measured voltage.

We claim:

1. In the manufacture of integrated circuit devices, a method for testing at least one electrical conductor element by determining nonlinearity of electrical resistance of said element as a function of current flowing in said element characterized in that said method comprises the steps of (1) electrically connecting said element to the output terminals of an AC-coupled linear electrical network whose input terminals are connected to an electrical wave generator, (2) activating said wave generator, and (3) measuring the average voltage across said element.

2. In the manufacture of integrated circuit devices, a method for testing at least one electrical conductor element by determining nonlinearity of electrical resistance of said element as a function of current flowing in said element characterized in that said method comprises the steps of (1) electrically connecting said element to the output terminals of an AC-coupled linear electrical network whose input terminals are connected to an electrical wave generator, (2) activating said wave generator, and (3) measuring the resulting average current through or voltage across said element.

3. Method of claim 2 in which said electrical network consists of a blocking capacitor.

4. Method of claim 2 in which said electrical network consists of a transformer.

5. Method of claim 2 in which said electrical wave generator produces a train of rectangular pulses.

6. Method of claim 5 in which the duty cycle of said wave generator is in the range of from ten percent to 40 percent or in the range of from 60 percent to 90 percent.

7. Method of claim 3 in which said average voltage is measured by means of a digital voltmeter.

8. Method of claim 2 in which said average current is measured by means of an operational amplifier.

9. A device for testing at least one electrical conductor element by determining nonlinearity of electrical resistance of said element as a function of current flowing in said element characterized in that said device comprises (1) an electrical wave generator connected to the input terminals of an AC-coupled linear electrical network whose output terminals are connected to an averaging voltmeter and (2) means for electrically connecting said electrical conductor element to the output terminals of said network.

10. A device for testing at least one electrical conductor element by determining nonlinearity of electrical resistance of said element as a function of current flowing in said element characterized in that said device comprises (1) an electrical wave generator connected to the input terminals of an AC-coupled linear electrical network whose output terminals are connected to an averaging current or voltmeter and (2) means for electrically connecting said electrical conductor element to said network.

11. Device of claim 10 in which said electrical network consists of a blocking capacitor.

12. Device of claim 10 in which said electrical network consists of a transformer.

13. Device of claim 10 in which said electrical wave generator produces a train of rectangular pulses.

14. Device of claim 13 in which said electrical wave generator has a duty cycle in the range of from ten percent to 40 percent or in the range of from 60 percent to 90 percent.

15. Device of claim 10 in which said averaging voltmeter is a digital voltmeter.

16. Device of claim 10 in which said averaging current meter comprises an operational amplifier.

17. A method for testing an electrical conductor by determining nonlinearity of electrical resistance of said conductor as a function of current flowing in said conductor comprising applying a wave signal to the conductor such that either the time average of the current in said conductor or the time average of the voltage across said conductor is zero and such as to produce a voltage across said conductor or a current in said conductor, respectively, and measuring the time average of said voltage or said current, respectively.

* * * * *